(12) United States Patent
Schubert (10) Patent No.: US 8,952,406 B2
(45) Date of Patent: Feb. 10, 2015

(54) LIGHTING DEVICES INCLUDING PATTERNED OPTICAL COMPONENTS AND ASSOCIATED DEVICES, SYSTEMS, AND METHODS

(75) Inventor: Martin F. Schubert, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 33 days.

(21) Appl. No.: 13/547,897

(22) Filed: Jul. 12, 2012

(65) Prior Publication Data

US 2014/0014988 A1 Jan. 16, 2014

(51) Int. Cl.
*H01L 33/50* (2010.01)

(52) U.S. Cl.
USPC ........ 257/98; 257/100; 257/E33.071; 438/29; 438/27

(58) Field of Classification Search
CPC ..... H01L 33/50; H01L 33/501; H01L 33/502; H01L 33/504; H01L 33/508
USPC .......................................................... 257/98
See application file for complete search history.

(56) References Cited

U.S. PATENT DOCUMENTS

| | | | |
|---|---|---|---|
| 6,194,826 B1 | 2/2001 | Satou et al. | |
| 6,391,504 B2 | 5/2002 | Tai et al. | |
| 6,411,032 B1 | 6/2002 | Shiiki et al. | |
| 7,091,656 B2 | 8/2006 | Murazaki et al. | |
| 7,855,501 B2 | 12/2010 | Tanimoto et al. | |
| 8,129,206 B2 * | 3/2012 | Lin et al. | 438/27 |
| 2010/0308354 A1 | 12/2010 | David et al. | |
| 2011/0128471 A1 | 6/2011 | Suckling et al. | |

FOREIGN PATENT DOCUMENTS

WO 2010086766 A1 8/2010

* cited by examiner

*Primary Examiner* — Matthew W Such
*Assistant Examiner* — David Spalla
(74) *Attorney, Agent, or Firm* — Perkins Coie LLP (57) ABSTRACT

Lighting devices including light-emitting diodes and associated devices, systems, and methods are disclosed herein. A lighting device configured in accordance with a particular embodiment includes a lighting-emitting diode and an optical component along a radiation path of the lighting-emitting diode. The optical component includes a color-converting material with walls defining a pattern, the walls extending generally entirely through a thickness of the color-converting material. A total surface area of the walls within a primary zone of the optical component is greater than a total surface area of color-converting features at a major side of the color-converting material. A method for making a lighting device in accordance with a particular embodiment includes combining an optical component and a light-emitting diode, and shaping a color-converting material of the optical component to have a thickness and a pattern of walls selected to control the color of light output from the lighting device.

28 Claims, 9 Drawing Sheets

LIGHTING DEVICES INCLUDING PATTERNED OPTICAL COMPONENTS AND ASSOCIATED DEVICES, SYSTEMS, AND METHODS

TECHNICAL FIELD

The present technology is related to lighting devices including patterned optical components. In particular, some embodiments are related to lighting devices including optical components with color-converting materials patterned to facilitate more precise and/or accurate control of light-output color.

BACKGROUND

Light-emitting diodes (LEDs) are used in numerous products for backlighting, general illumination, and other purposes. Without modification, LEDs typically emit light having a narrow range of wavelengths that can be undesirable for many applications. Lighting devices including LEDs, therefore, often include optical components to modify or supplement light from the LEDs. These optical components can include color-converting materials, such as composites including phosphor or other color-converting particles that absorb light at certain wavelengths and emit light at different wavelengths. For example, some lighting devices include LEDs that emit blue light and color-converting particles that absorb some of the blue light and convert it into yellow light. The combination of blue light from the LEDs and yellow light from the color-converting particles can appear white. Known color-converting particles useful for this purpose include yttrium aluminum garnet doped with suitable rare earth elements, such as cerium.

Figure 1:
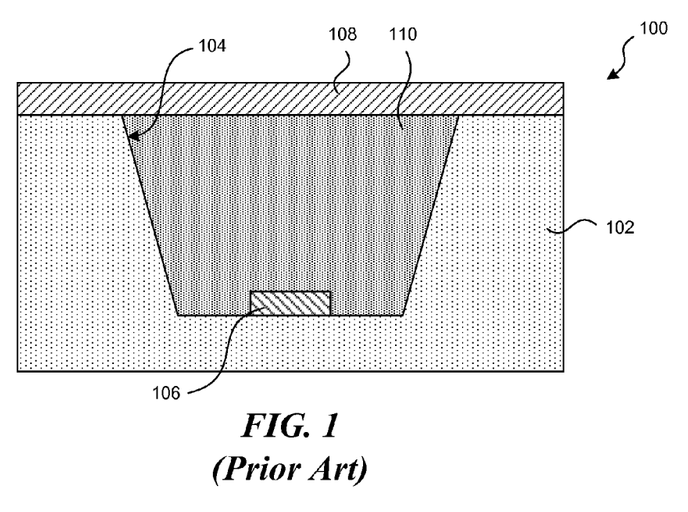
FIG. 1 is a partially schematic cross-sectional view illustrating a lighting device having an optical component in accordance with the prior art.

FIG. 1 is a partially-schematic cross-sectional view of a conventional lighting device 100 including a heat sink 102 having a trench 104 and an LED 106 within the trench 104. The device 100 further includes an optical component 108 extending over the trench 104 and a fill material 110 within the trench 104 around the LED 106. The optical component 108 includes color-converting particles (not shown) suspended within a transparent matrix material. The color-converting particles absorb and convert a portion of the emitted light from the LED 106. Another portion of the emitted light either passes through the optical component 108 without being converted or is reflected back into the trench 104. The amount of converted light relative to unconverted light causes the device 100 to have a characteristic color, which can be quantified, for example, as correlated color temperature (CCT) or as a set of coordinates on a chromaticity diagram. For many applications, it is desirable to have multiple lighting devices with similar colors. For example, lighting products incorporating multiple lighting devices with similar colors generally are more aesthetically appealing during use than lighting products incorporating multiple lighting devices with widely varying colors. Furthermore, manufacturers of lighting products often specify lighting characteristics for particular product designations. Incorporating lighting devices with similar colors into all lighting products having the same product designation can be useful to match specified characteristics, to satisfy customer expectations, and/or to meet industry standards.

Variables affecting the amount of converted light relative to unconverted light for a lighting device can include the sizes and concentration of color-converting particles within a color-converting material as well as the thickness of the color-converting material. The sizes of the color-converting particles are often well controlled using mesh screening and/or other conventional techniques. Similarly, selecting a suitable matrix material, uniformly distributing the color-converting particles throughout the matrix material, and other conventional techniques can be sufficient to cause the concentration of the color-converting particles to be relatively consistent. The thickness of the color-converting material, however, can be difficult to control adequately using conventional techniques and can be highly susceptible to process excursions. As a result, optical components of lighting devices from the same manufacturing processes often have significantly different thicknesses, causing the lighting devices to have significantly different color outputs. Although lighting devices are generally binned according to color after manufacturing to yield separate batches having similar colors, this only partially addresses the issue of color variability. For example, even if binning is used, wide color variation among lighting devices can cause large numbers of the lighting devices to fall into undesirable bins having relatively low market values. Furthermore, testing and binning are additional processing steps that increase manufacturing costs.

For one or more of the reasons stated above, and/or for other reasons not stated herein, there is a need for innovation in the field of lighting devices directed to enhancing the accuracy and/or precision of color control in manufacturing processes for the lighting devices.

BRIEF DESCRIPTION OF THE DRAWINGS

Many aspects of the present technology can be better understood with reference to the following drawings. The components in the drawings are not necessarily to scale. Instead, emphasis is placed on illustrating clearly the principles of the present technology.

FIG. 2 is a partially schematic cross-sectional view illustrating a lighting device in accordance with an embodiment of the present technology.

FIG. 2-1 is an enlarged view of a portion of FIG. 2 illustrating details of an LED of the lighting device shown in FIG. 2.

DETAILED DESCRIPTION

Specific details of several embodiments of lighting devices and associated devices, systems, and methods are described herein. The term "device" can refer to a finished device or to an assembly or other structure at various stages of processing before becoming a finished device. The term "solid-state device" can refer to a solid-state device that converts electrical current into light, a solid-state device that converts light into electrical current, or another suitable solid-state device. Additionally, depending upon the context in which it is used, the term "substrate" can refer to a wafer-level substrate or to a singulated, die-level substrate. A person having ordinary skill in the relevant art will recognize that suitable steps of the processes described herein can be performed at the wafer level or at the die level. A person having ordinary skill in the relevant art will also understand that the present technology may have additional embodiments, and that the present technology may be practiced without several of the details of the embodiments described herein with reference to FIGS. 2-16.

For ease of reference, throughout this disclosure identical reference numbers are used to identify similar or analogous components or features, but the use of the same reference number does not imply that the parts should be construed to be identical. Indeed, in many examples described herein, the identically numbered parts are distinct in structure and/or function. Furthermore, the same shading is sometimes used to indicate materials in cross section that can be compositionally similar, but the use of the same shading does not imply that the materials should be construed to be identical.

Figures 2, 21:
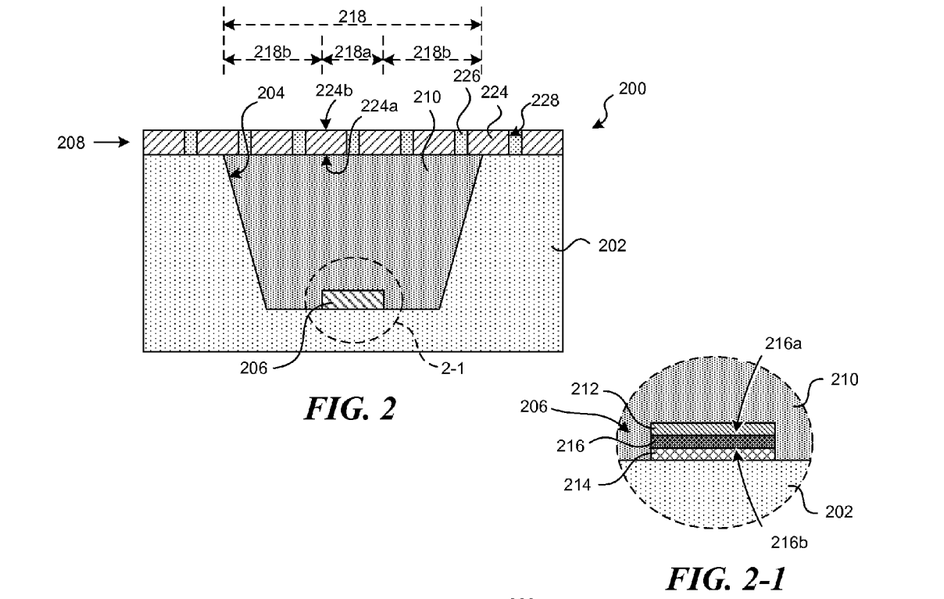

FIG. 2 is a partially schematic cross-sectional view illustrating a lighting device 200 in accordance with an embodiment of the present technology. The device 200 can include a heat sink 202 having a trench 204 and an LED 206 within the trench 204. The device 200 can further include an optical component 208 extending over the trench 204 and a fill material 210 within the trench 204 around the LED 206. As shown in FIG. 2, the optical component 208 can be a remote optical component spaced apart from the LED 206. In other embodiments, the optical component 208 can be directly adjacent to the LED 206, e.g., the optical component 208 can contact the LED 206. The optical component 208 can be positioned along a radiation path of the device 200, and the LED 206 can be configured to emit light via the radiation path. In some embodiments, the optical component 208 can be one component of an optical system having other suitable optical structures, e.g., lenses, encapsulating layers, diffusers, etc. FIG. 2-1 is an enlarged view of a portion of FIG. 2 illustrating details of the LED 206.

As shown in FIG. 2-1, the LED 206 can include a first semiconductor material 212, a second semiconductor material 214, and an active region 216 between the first semiconductor material 212 and the second semiconductor material 214. The active region 216 can have a first major side 216a toward the optical component 208 and a second major side 216b generally opposite the first major side 216a.

The optical component 208 can include a first material 224 and a second material 226 distributed in a pattern defined by walls 228 within the optical component 208. The first material 224 can have a first major side 224a toward the LED 206 and a second major side 224b generally opposite the first major side 224a. The first material 224 can be a color-converting material having a characteristic level of color conversion greater than that of the second material 226. The pattern of walls 228 can be selected to reduce the influence of the thickness of the first material 224 on the color of light output from the device 200. This can be advantageous, for example, when the pattern of walls 228 can be more accurately and/or precisely controlled than the thickness of the first material 224. Conventional semiconductor manufacturing techniques for forming patterns of features typically have greater accuracy and/or precision than conventional semiconductor manufacturing techniques for controlling thicknesses of materials. For example, while patterns of features are typically formed using photolithography, thicknesses of materials are typically controlled using less accurate and/or precise techniques, such as monitoring and timing deposition and removal processes. With respect to most materials in semiconductor devices, some variability in the accuracy and/or precision of thickness is of little or no consequence. As discussed above, variability in the accuracy and/or precision of the thickness of color-converting materials, however, can be problematic. Embodiments of the present technology can allow for greater control over color conversion without necessarily improving the accuracy and/or precision of techniques for controlling the thickness of the first and/or second materials 224, 226. Instead, the relative influence of the techniques for controlling the thickness of the first and/or second materials 224, 226 can be reduced in favor of more accurate and/or precise techniques for forming patterns of walls 228.

Some suitable techniques, e.g., photolithography, for forming patterns of walls 228 can have margins of error less than about 5 micrometers, e.g., less than about 3 micrometers or less than about 1 micrometer. This level of accuracy and/or precision can be significantly greater than the level of accuracy and/or precision achievable using conventional techniques for controlling thicknesses of materials. Accordingly, when the pattern of walls 228 influences or otherwise controls the level of color conversion to a greater extent than the thickness of the first material 224, more accurate and/or precise control over the level of color conversion is possible. In some embodiments, multiple devices 200, e.g., resulting from a single manufacturing process during a production period, can have generally matching patterns of walls 228 with a first degree of precision and generally matching thicknesses of the first material 224 with a lesser, second degree of precision. The patterns of walls 228 having the first degree of precision can cause an average variation of light-output color among the devices 200 to be less than it would be if the optical components of the devices 200 were not patterned. For example, more than about 80% of the devices 200 can have light-output colors within a 2-step MacAdam Ellipse, a 1-step MacAdam Ellipse, or another suitable range. Furthermore, even when the accuracy and/or precision of techniques for forming the pattern of walls 228 are similar to or less than the accuracy and/or precision of techniques used to control the thickness of the first material 224, forming the pattern of walls 228 can still be useful, e.g., by providing an additional parameter that can be varied for controlling the color of light output from the device 200.

The first material 224 can be, for example, a composite material including color-converting particles within a matrix material, e.g., a generally transparent matrix material. As another example, the first material 224 can be an agglomeration of color-converting particles without a matrix material.

The second material 226 can be, for example, a non-color-converting material, e.g., a generally transparent fill material. In some embodiments, the walls 228 can be the inner surfaces of holes, apertures, trenches, channels, or other depressions in the first material 224, and/or the walls 228 can be vertical surfaces of the second material 226. Furthermore, the walls 228 can define an interface between the first and second materials 224, 226. In other embodiments, the optical component 208 does not include the second material 226 such that apertures defined by the walls 228 are open. In these embodiments, for example, the device 200 can be configured to receive additional packaging, e.g., bulk encapsulant, prior to use.

Figure 3:
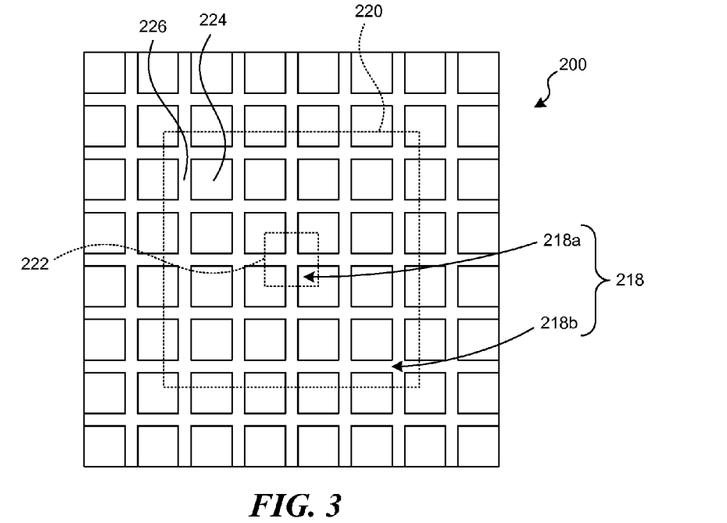
FIG. 3 is a partially schematic plan view of the lighting device shown in FIG. 2.

FIG. 3 is a partially schematic plan view of the device shown in FIG. 2. As shown in FIG. 3, the optical component 208 can include a primary zone 218 (shown within dashed line 220 in FIG. 3) along the direct path of light emitted from the active region 216 of the LED 206. The primary zone 218 can be aligned with the trench 204 (FIG. 2) such that light emitted from the LED 206 normal and off-normal to the first major side 216a of the active region 216 passes into the primary zone 218. In contrast, the heat sink 202 can block the direct path of light from the LED 206 to portions of the optical component 208 outside the primary zone 218. The portions of the optical component 208 outside the primary zone 218 can, however, receive some reflected light, e.g., from walls of the trench 204 and/or from color conversion occurring within the primary zone 218. In other embodiments, generally all of the optical component 208 can be within the primary zone 218. Referring to FIGS. 2 and 3, the optical component 208 can include a first or central region 218a (shown within dashed line 222 in FIG. 3) and a second or peripheral region 218b (shown between dashed line 220 and dashed line 222 in FIG. 3) within the primary zone 218. The first region 218a can be superimposed over the active region 216 of the LED 206, and the second region 218b can extend around the first region 218a in a plane parallel to the first major side 216a of the active region 216. Light emitted from the LED 206 normal to the first major side 216a of the active region 216 can pass into the first region 218a of the optical component 208, and light emitted from the LED 206 off-normal to the first major side 216a of the active region 216 can pass into the second region 218b of the optical component 208.

As discussed above, the pattern of walls 228 can be selected to control the color of light output from the device 200, e.g., in conjunction with the thickness of the first material 224 and/or other suitable factors. With reference to FIGS. 2 and 3, the pattern of walls 228 can define one or more negative features (shown coextensive with the second material 226) and one or more positive features (shown coextensive with the first material 224). In some embodiments, the positive features can be color-converting features having shape characteristics corresponding to the color of light output from the device 200. The combined negative features can define a negative area and the combined positive features can define a positive area that is an inverse of the negative area. The negative and positive areas can be defined, for example, within the primary zone 218 of the optical component 208 in a plane parallel to one or more reference planes within the device 200, e.g., the first major side 216a of the active region 216. The pattern of walls 228 can extend over all or a portion of the optical component 208. In some embodiments, the pattern of walls 228 can extend over at least about 50%, e.g., at least about 75%, or at least about 90%, of the second region 218b of the optical component 208. As shown in FIG. 3, the pattern of walls 228 can also extend over the first region 218a of the optical component 208. In other embodiments, as discussed with reference to FIGS. 7 and 8 below, it can be useful to exclude the pattern of walls 228 from the first region 218a.

The color of light output from the device 200 can be directly proportional to the volume of the first material 224 within the primary zone 218 of the optical component 208. When the volume is greater, more color-converting particles can be positioned along the path of light exiting the device 200, thereby causing more color conversion. The pattern of walls 228 and the thickness of the first material 224 are both variables that can affect the volume of the first material 224. The pattern of walls 228, the thickness of the first material 224, and/or other aspects of the device 200, however, can be selected such that varying, e.g., scaling, the pattern of walls 228 has a proportionally greater effect on the color of light output from the device 200 than varying, e.g., scaling, the thickness of the first material 224. For example, with reference to FIG. 2, when the surface area of the walls 228 is greater than the surface area of the first material 224 at the first and/or second major sides 224a, 224b of the first material 224, varying the pattern of walls 228 can have a greater additive or subtractive effect on the volume of the first material 224 than varying the thickness of the first material 224. Accordingly, in some embodiments, the first material 224 can be shaped such that the surface area at the walls 228 is greater than the surface area at the first and/or second major sides 224a, 224b of the first material 224 for more accurate and/or precise control of the color of light output from the device 200 compared to controlling only the thickness of the first material 224. For example, the pattern of walls 228 can define color-converting features (shown coextensive with the first material 224), and a total surface area of the walls 228 within the primary zone 218 can be greater than a total surface area of the color-converting features at the first and/or second major sides 224a, 224b of the first material 224 within the primary zone 218. In other embodiments, the first material 224 can have other suitable shape characteristics.

In some embodiments, the pattern of walls 228 can extend generally entirely through the thickness of the first material 224 within the primary zone 218 of the optical component 208. The walls 228, for example, can span generally the entire distance between the first and second major sides 224a, 224b of the first material 224. This can reduce the surface area of the first material 224 at one or both of the first and second major sides 224a, 224b of the first material 224. In other embodiments, the walls 228 can extend only partially through the thickness of the first material 224. For example, the first material 224 can extend into the negative area at a thickness less than a thickness of the first material 224 in the positive area. Thus, the first material 224 can have a pattern of thicknesses corresponding to the pattern of walls 228.

Figure 4:
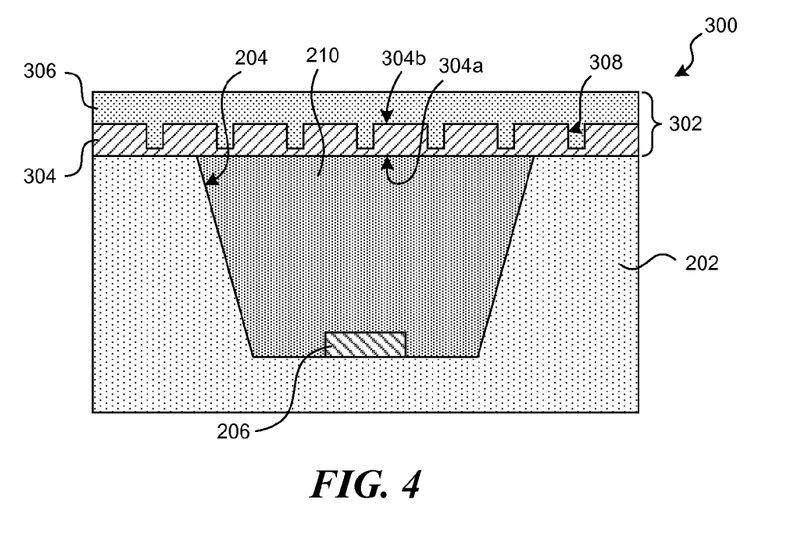
FIG. 4 is a partially schematic cross-sectional view illustrating a lighting device in accordance with another embodiment of the present technology.

FIG. 4 is a partially schematic cross-sectional view illustrating a lighting device 300 in accordance with another embodiment of the present technology. The device 300 can include an optical component 302 having a color-converting material 304 and a transparent material 306, with the color-converting material 304 between the transparent material 306 and the fill material 210 within the trench 204. The color-converting material 304 can have a first major side 304a toward the LED 206 and a second major side 304b generally opposite the first major side 304a. As shown in FIG. 4, the color-converting material 304 can have a pattern of walls 308 that extend only partially through the thickness of the color-converting material 304. The transparent material 306 can be adjacent to the color-converting material 304 at the walls 308. In some embodiments, the transparent material 306 can define an optical substrate of the optical component 302 with a shape that is an inverse of the shape of the color-converting material 304. As described in greater detail below, forming the optical component 302 can include using the optical substrate as a mold for the color-converting material 304.

Figure 5:
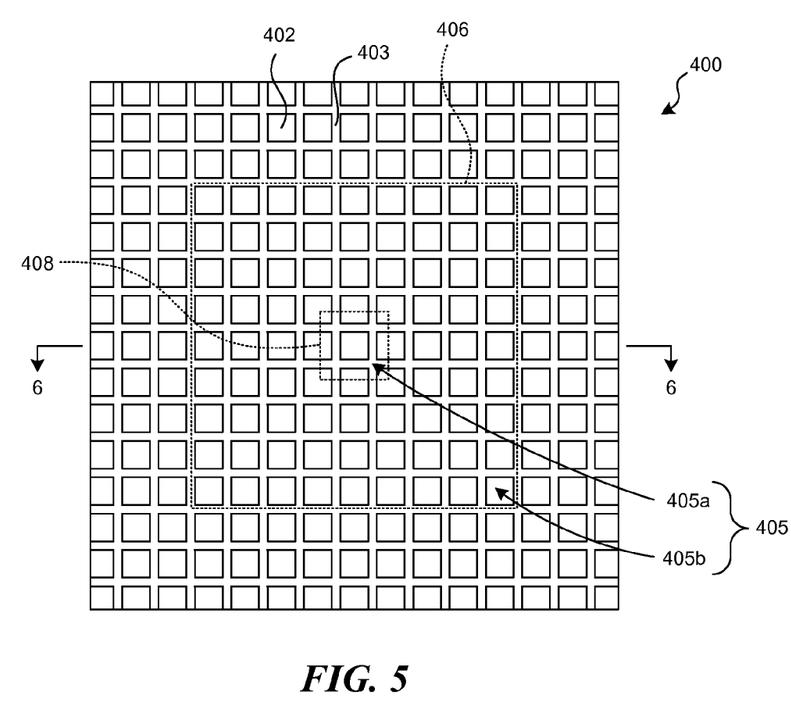
FIG. 5 is a partially schematic plan view illustrating an optical component in accordance with an embodiment of the present technology.
Figure 6:
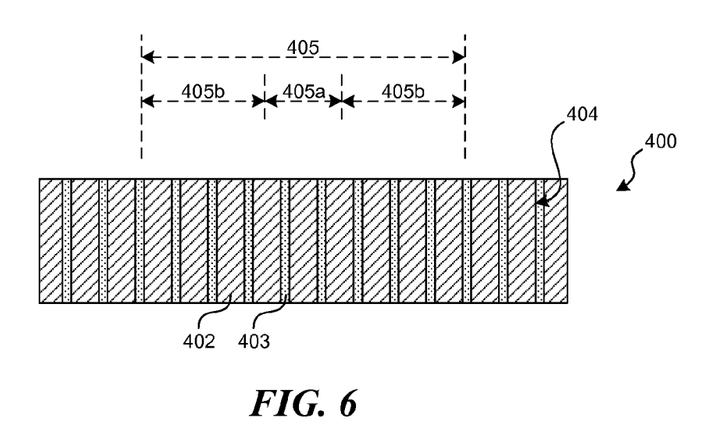
FIG. 6 is a partially schematic cross-sectional view illustrating the optical component shown in FIG. 5 taken along the line 6-6.
Figure 7:
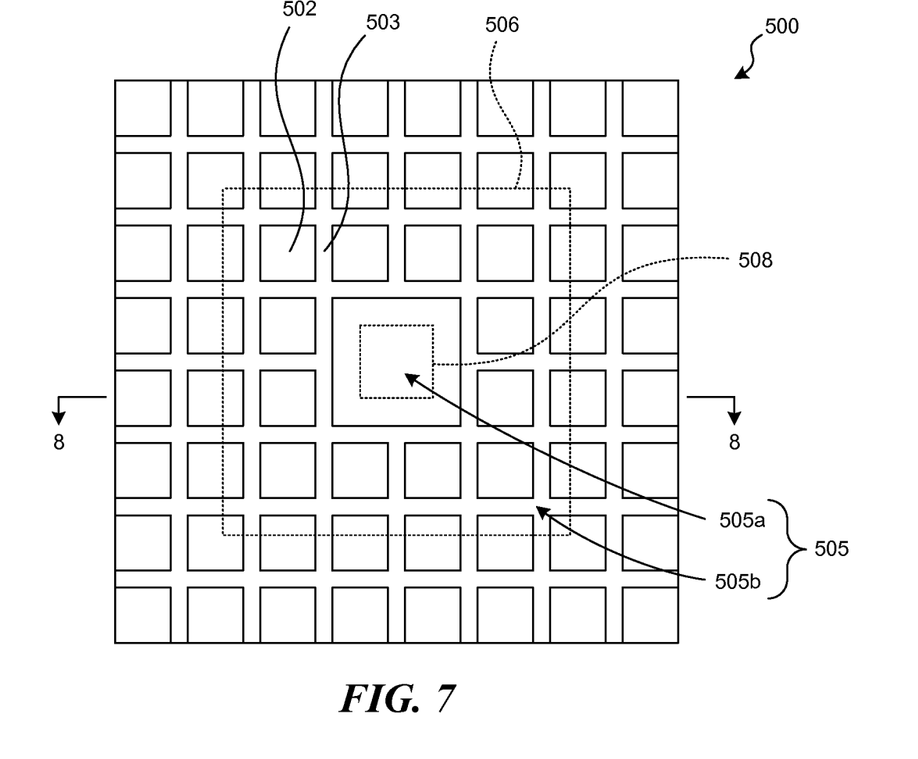
FIG. 7 is a partially schematic plan view illustrating an optical component in accordance with another embodiment of the present technology.
Figure 8:
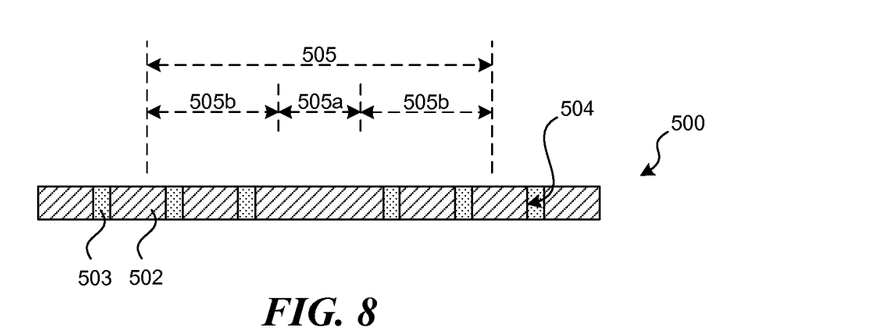
FIG. 8 is a partially schematic cross-sectional view illustrating the optical component shown in FIG. 7 taken along the line 8-8.
Figure 9:
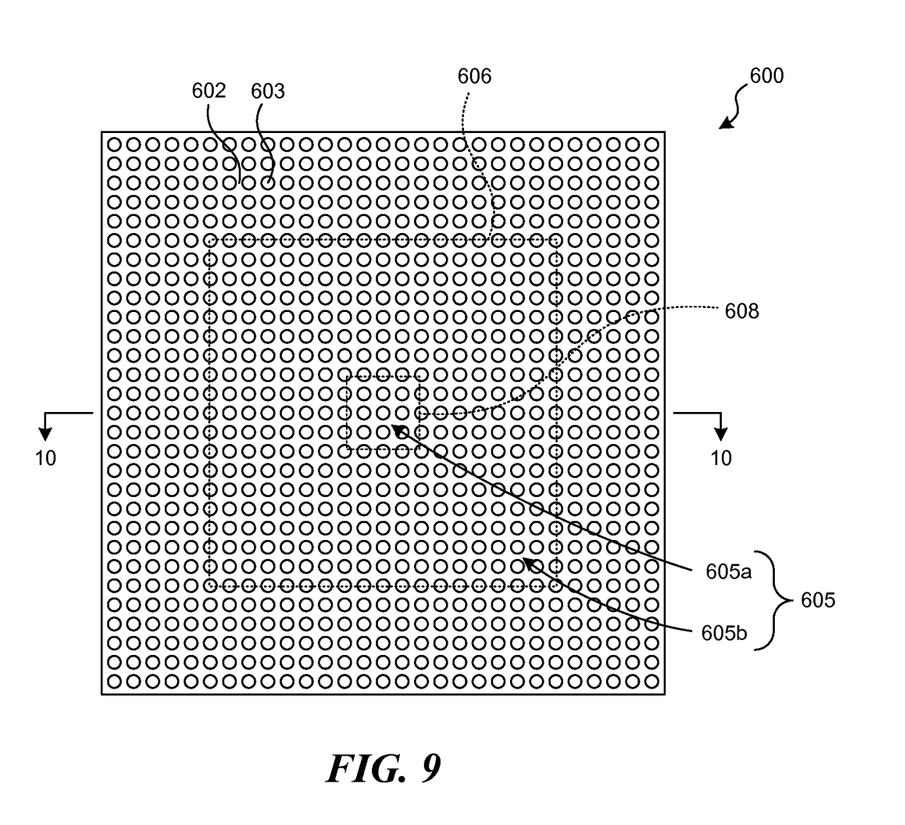
FIG. 9 is a partially schematic plan view illustrating an optical component in accordance with another embodiment of the present technology.
Figure 10:
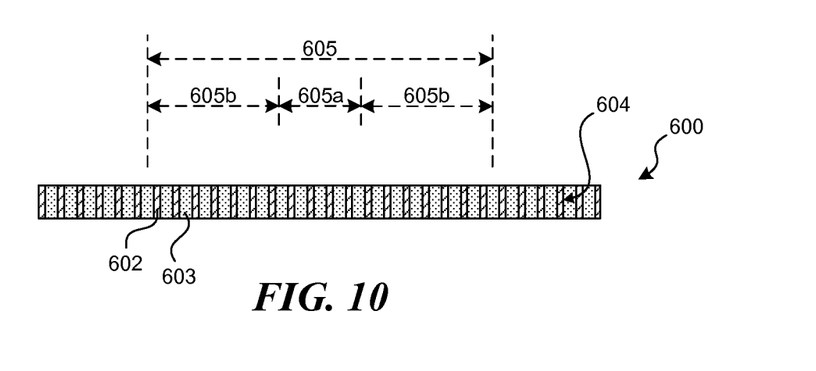
FIG. 10 is a partially schematic cross-sectional view illustrating the optical component shown in FIG. 9 taken along the line 9-9.
Figure 11:
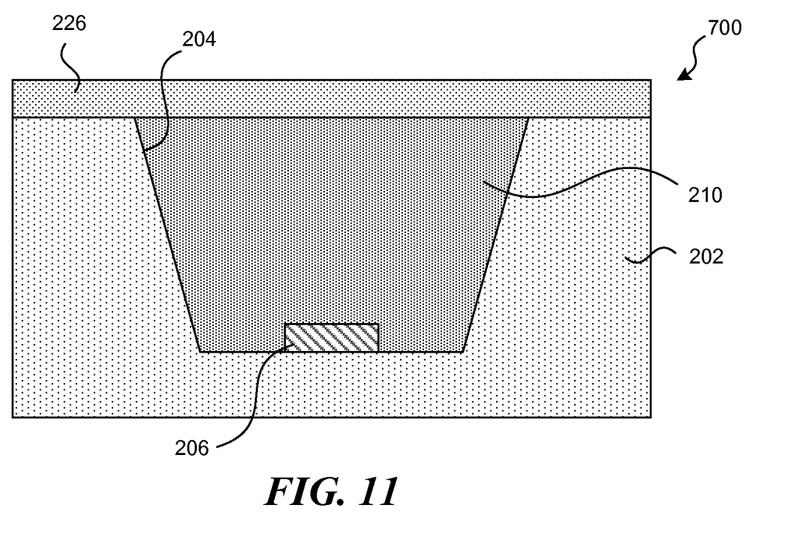
FIGS. 11-15 are partially schematic cross-sectional views illustrating an assembly after selected stages in a method for making the lighting device shown in FIG. 2 or other suitable lighting devices in accordance with an embodiment of the present technology.
Figure 12:
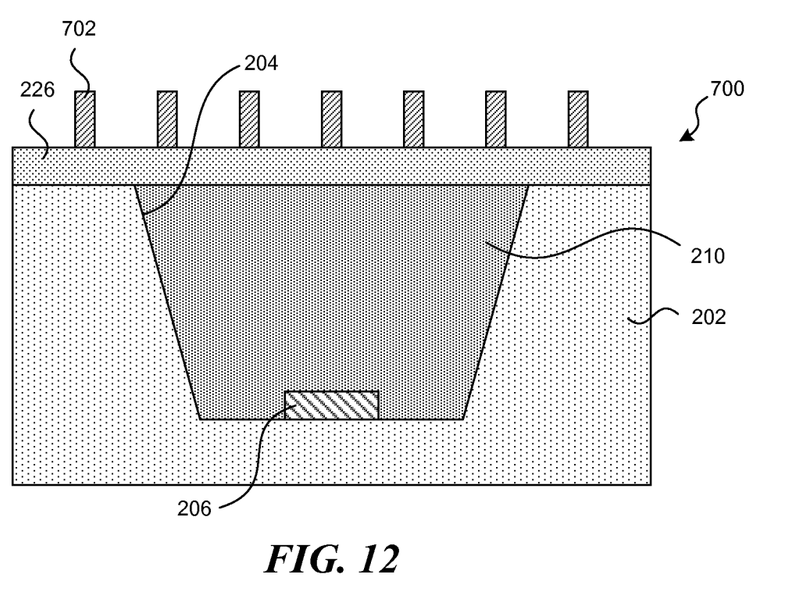
Figure 13:
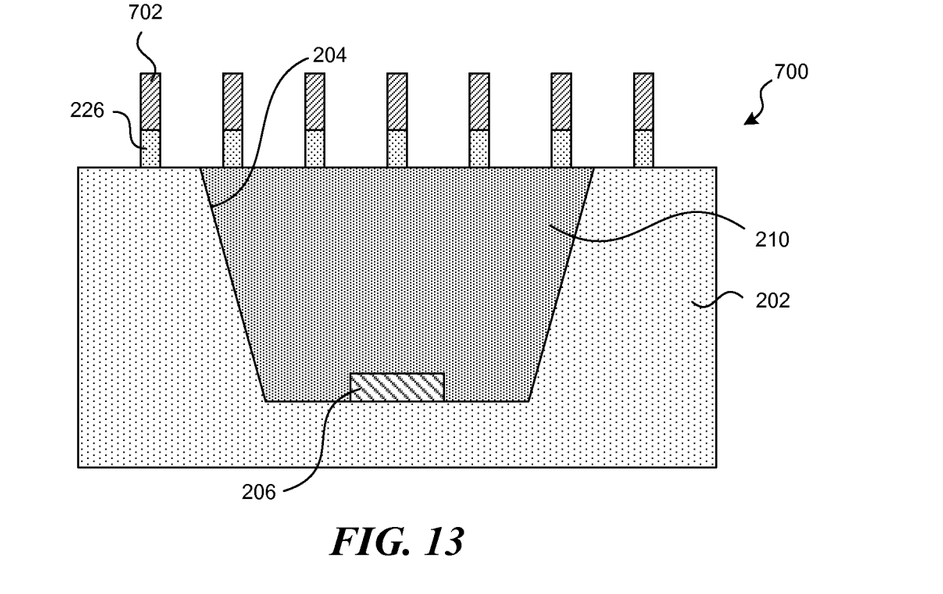

FIGS. 5, 7, and 9 are partially schematic cross-sectional views, and FIGS. 6, 8, and 10, respectively, are corresponding partially schematic plan views illustrating several examples of optical components having patterns of walls in accordance with additional embodiments of the present technology. As shown in FIGS. 5 and 6, an optical component 400 can include a first material 402 (e.g., a color-converting material), a second material 403 (e.g., a transparent material), and a pattern of walls 404 between the first and second materials 402, 403. The pattern of walls 404 can define a negative area (shown coextensive with the second material 403) and a positive area (shown coextensive with the first material 402) that is an inverse of the negative area. The optical component 400 can include a primary zone 405 (shown within dashed line 406 in FIG. 5), a central region 405a (shown within dashed line 408 in FIG. 5), and a peripheral region 405b (shown between dashed line 406 and dashed line 408 in FIG. 5). The pattern of walls 404 shown in FIGS. 5 and 6 is similar to the pattern of walls 228 shown in FIGS. 2 and 3, but the pattern of walls 404 defines a smaller line width and a greater line density of the second material 403 than the line width and line density of the second material 226 shown in FIGS. 2 and 3. Furthermore, the first material 402 shown in FIGS. 5 and 6 is thicker than the first material 224 shown in FIGS. 2 and 3. Decreasing the average feature (e.g., line) width of the second material 403, increasing the average feature (e.g., line) density of the second material 403, and/or increasing the average thickness of the first material 402 can increase the relative influence of the pattern of walls 404 on the color of light exiting the optical component 400 and decrease the relative influence of the thickness of the first material 402 on the color of light exiting the optical component 400. In some embodiments, increasing the thickness of the first material 402 can include decreasing a concentration of color-converting particles within the first material 402.

In some embodiments, a suitable pattern of walls can extend over some portions of an optical component and not others. As shown in FIGS. 7 and 8, an optical component 500 can include a first material 502, a second material 503, and a pattern of walls 504 between the first and second materials 502, 503. The pattern of walls 504 can define a negative area (shown coextensive with the second material 503) and a positive area (shown coextensive with the first material 502) that is an inverse of the negative area. The optical component 500 can include a primary zone 505 (shown within dashed line 506 in FIG. 7), a central region 505a (shown within dashed line 508 in FIG. 7), and a peripheral region 505b (shown between dashed line 506 and dashed line 508 in FIG. 7). It can be useful in some cases to eliminate or reduce the presence of the negative area and/or the pattern of walls 504 in the central region 505a. For example, with reference to FIG. 7, the positive area can extend over generally the entire central region 505a, and the central region 505a can be generally without the pattern of walls 504. In other embodiments, the central region 505a can have a lower negative-area-to-positive-area ratio than the peripheral region 505b.

In operation, when the optical component 500 is generally parallel to and centered over a major side of an active region of an LED (not shown), light normal to the major side can have a shorter direct path through the optical component 500 than light off-normal to the major side. This can cause light passing through the peripheral region 505b to have a greater degree of color conversion than light passing through the central region 505a, thereby decreasing the overall color uniformity of light exiting the optical component 500. When the central region 505a is superimposed over the major side of the active region, reduced presence of the negative area and/or the pattern of walls 504 within the central region 505a can at least partially compensate for this phenomenon by causing a higher concentration of color-converting particles to be along the path of the light normal to the major side than along the path of light off-normal to the major side.

In the patterns of walls 228, 404, 504 shown in FIGS. 3, 5, and 7, the negative areas are continuous and the positive areas are discontinuous. In other embodiments, the positive areas can be continuous and the negative areas can be discontinuous. In still other embodiments, both the positive and negative areas can be discontinuous. FIGS. 9 and 10 illustrate an optical component 600 that can include a first material 602, a second material 603, and a pattern of walls 604 between the first and second materials 602, 603. The pattern of walls 604 can define a negative area (shown coextensive with the second material 603) and a positive area (shown coextensive with the first material 602). The optical component 600 can include a primary zone 605 (shown within dashed line 606 in FIG. 9), a central region 605a (shown within dashed line 608 in FIG. 9), and a peripheral region 605b (shown between dashed line 606 and dashed line 608 in FIG. 9). The negative area can include an array of cylindrical features. In other embodiments, features of negative or positive areas can have other suitable shapes, e.g., elongated, non-elongated, polygonal, etc. A variety of other suitable patterns of walls 604 are also possible.

Figure 14:
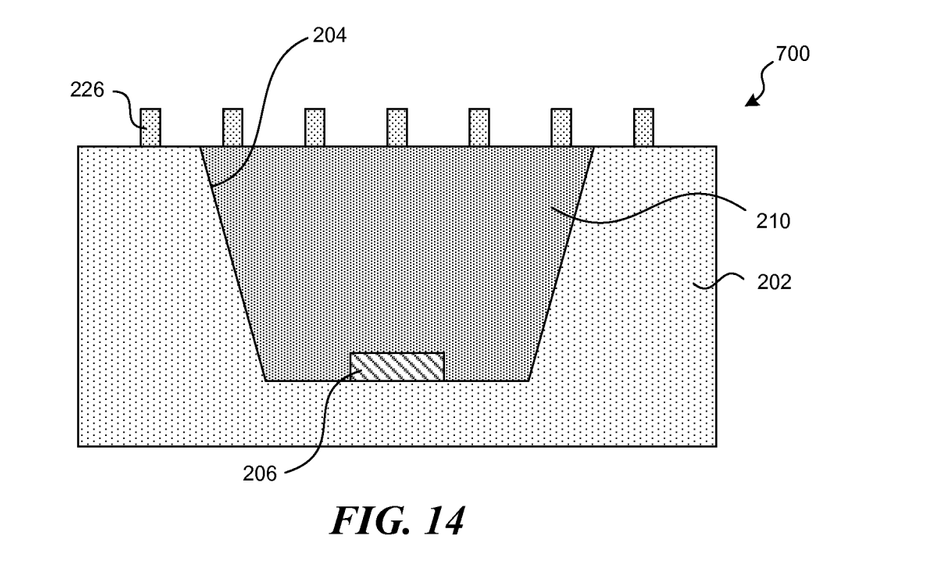
Figure 15:
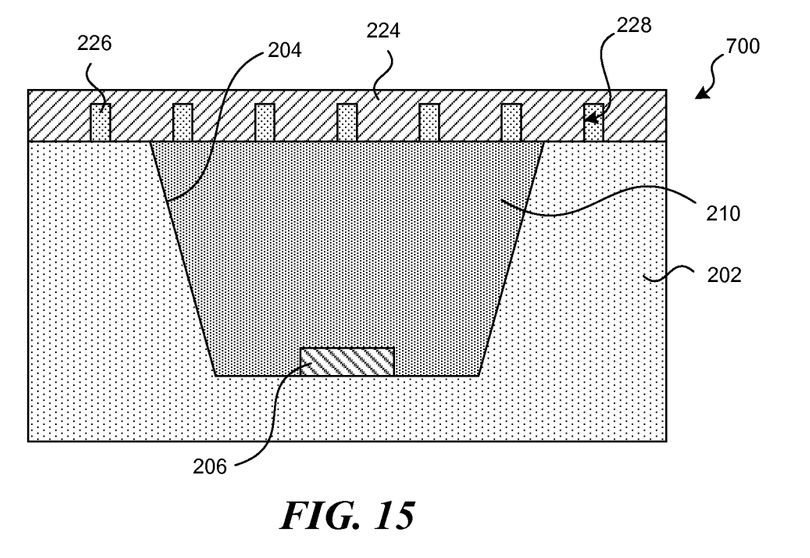
Figure 16:
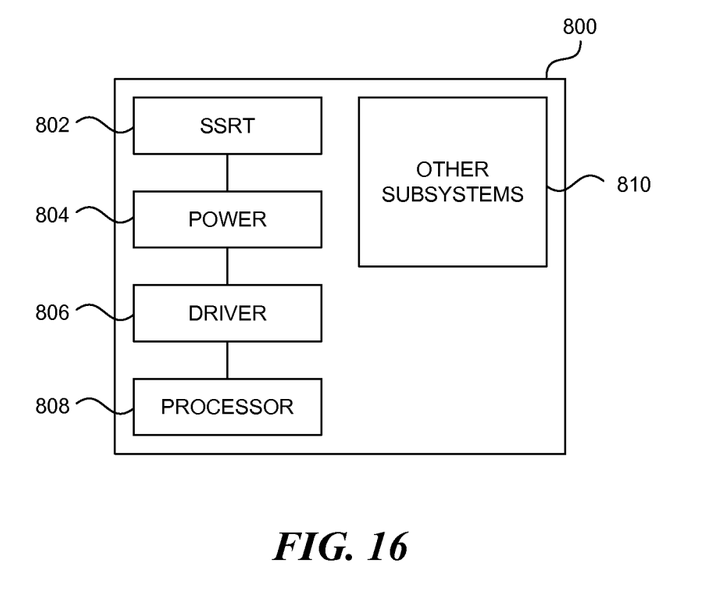
FIG. 16 is a block diagram illustrating a system that incorporates a lighting device in accordance with an embodiment of the present technology.

FIGS. 11-15 are partially schematic cross-sectional views illustrating an assembly 700 after selected steps in a method for making the device 200 shown in FIG. 2 or other suitable lighting devices in accordance with an embodiment of the present technology. At the step shown in FIG. 13, the assembly 700 can include the heat sink 202 and the LED 206 within the trench 204 of the heat sink 202. The assembly 700 can also include the fill material 210 within the trench 204 and the second material 226 extending over the fill material 210 and over portions of the heat sink 202 outside the trench 204. The second material 226 can include, for example, a generally transparent polymeric material (e.g., epoxy, silicone, polyimide, or acrylic), a generally transparent refractory material (e.g., silicon dioxide), or another suitable material. As shown in FIG. 14, photoresist 702 can be introduced onto the second material 226 and patterned using suitable photolithography techniques. As shown in FIG. 15, the assembly 700 can then be etched to pattern the second material 226. As shown in FIG. 16, after etching, the remaining photoresist 702 can be removed, e.g., using plasma ashing, wet cleans, or other suitable techniques.

FIG. 15 shows the assembly 700 after the first material 224, e.g., the color-converting material, has been introduced. The second material 226 can shape the first material 224 to a shape corresponding to a desired color of light output for the device 200 upon completion. As shown in FIG. 15, the first material 224 can be deposited such that an excess of first material 244 covers the second material 226. In some embodiments, the excess first material 224 can be left in place. Alternatively, the excess first material 224 can be removed, e.g., using mechanical, chemical-mechanical, or other suitable removal techniques. For example, the excess first material 224 can be non-solid and generally leveled with the patterned second material 226 using a screeding technique. After shaping, the solidity of the first material 224 can be increased and the first and second materials 224, 226 can form the optical component 208 shown in FIG. 2. In some embodiments, the first material 224 can include a curable material and increasing the solidity of the first material 224 can include partially or fully curing the first material 224, e.g., using ultraviolet light. In these and other embodiments, the first material 224 can be a composite material including color-converting particles within a matrix material. The matrix material, for example, can be a curable material and the color-converting particles can be relatively fixed within the matrix material after the matrix material has cured. Suitable matrix materials can include, for example, transparent epoxies, silicones, polyimides, acrylics, and other thermoplastic and thermosetting materials, among others. Suitable color-converting particles can include quantum dots, phosphor materials that exhibit luminescence, and/or other suitable materials.

Several suitable variations of the method shown in FIGS. 11-15 can be used to form the device 200 shown in FIG. 2 or other suitable devices in accordance with embodiments of the present technology. For example, the first material 224 can be selectively deposited to form the pattern of walls 228, e.g., using inkjet dispensing or other suitable techniques. In another example, the first and second materials 224, 226 can be reversed, such that depressions (e.g., apertures) are etched in or through the first material 224, and the second material 226 is deposited into the depressions. Furthermore, combining the optical component 208 (FIG. 2) with other portions of the device 200 can occur before or after the first material 224 is shaped. For example, with reference to FIG. 4, forming the optical component 302 of the device 300 can include independently forming an optical substrate from the transparent material 306, e.g., using photolithography, and then molding the color-converting material 304 around the optical substrate before or after combining the optical component 302 with other portions of the device 300. Furthermore, the optical substrate and/or the optical component 302 can be formed within a sheet and then singulated prior to being incorporated into the device 300.

Any of the lighting devices described herein with reference to FIGS. 2-15 can be incorporated into any of a myriad of larger and/or more complex systems, a representative example of which is the system 800 shown schematically in FIG. 16. The system 800 can include a lighting device 802, a power source 804, a driver 806, a processor 808, and/or other suitable subsystems or components 810. The system 800 can be configured to perform any of a wide variety of suitable functions, such as backlighting, general illumination, power generation, sensing, and/or other functions. Furthermore, the system 800 can include, without limitation, hand-held devices (e.g., cellular or mobile phones, tablets, digital readers, and digital audio players), lasers, photovoltaic cells, remote controls, computers, and appliances (e.g., refrigerators). Components of the system 800 can be housed in a single unit or distributed over multiple, interconnected units, e.g., through a communications network. The components of the system 800 can also include local and/or remote memory storage devices, and any of a wide variety of suitable computer-readable media.

This disclosure is not intended to be exhaustive or to limit the present technology to the precise forms disclosed herein. Although specific embodiments are disclosed herein for illustrative purposes, various equivalent modifications are possible without deviating from the present technology, as those of ordinary skill in the relevant art will recognize. In some cases, well-known structures and functions have not been shown or described in detail to avoid unnecessarily obscuring the description of the embodiments of the present technology. Although steps of methods may be presented herein in a particular order, alternative embodiments may perform the steps in a different order. Similarly, certain aspects of the present technology disclosed in the context of particular embodiments can be combined or eliminated in other embodiments. Furthermore, while advantages associated with certain embodiments of the present technology may have been disclosed in the context of those embodiments, other embodiments can also exhibit such advantages, and not all embodiments need necessarily exhibit such advantages or other advantages disclosed herein to fall within the scope of the technology. Accordingly, the disclosure and associated technology can encompass other embodiments not expressly shown or described herein.

Throughout this disclosure, the singular terms "a," "an," and "the" include plural referents unless the context clearly indicates otherwise. Similarly, unless the word "or" is expressly limited to mean only a single item exclusive from the other items in reference to a list of two or more items, then the use of "or" in such a list is to be interpreted as including (a) any single item in the list, (b) all of the items in the list, or (c) any combination of the items in the list. Additionally, the term "comprising" is used throughout to mean including at least the recited feature(s) such that any greater number of the same feature and/or additional types of other features are not precluded. Directional terms, such as "upper," "lower," "front," "back," "vertical," and "horizontal," may be used herein to express and clarify the relationship between various elements. It should be understood that such terms do not denote absolute orientation. Reference herein to "one embodiment," "an embodiment," or similar formulations means that a particular feature, structure, operation, or characteristic described in connection with the embodiment can be included in at least one embodiment of the present technology. Thus, the appearances of such phrases or formulations herein are not necessarily all referring to the same embodiment. Furthermore, various particular features, structures, operations, or characteristics may be combined in any suitable manner in one or more embodiments.

I claim:

1. A lighting device, comprising:
a light-emitting diode, the lighting device having a radiation path along which radiation is emitted by the light-emitting diode, the light-emitting diode including—
a first semiconductor material,
a second semiconductor material, and
an active region between the first semiconductor material and the second semiconductor material; and
an optical component positioned along the radiation path, the optical component including—
a color-converting material having a first side facing toward the light-emitting diode, a second side facing away from the light-emitting diode, and a thickness extending from the first side to the second side,
a central region, wherein light emitted from the light-emitting diode normal to a major side of the active region passes into the central region, and
a peripheral region around the central region in a plane parallel to the major side of the active region, wherein light emitted from the light-emitting diode off-normal to the major side of the active region passes into the peripheral region,
wherein the color-converting material includes a pattern of walls that—
is present at the peripheral region of the optical component,
is absent from the central region of the optical component,
is selected to control a color of light output from the lighting device, and extends generally entirely through the thickness of the color-convening material.

2. The lighting device of claim 1, wherein the optical component is spaced apart from the light-emitting diode.

3. The lighting device of claim 1, wherein:
the pattern of walls defines a shape of the color-converting material; and
the optical component further includes an optical substrate having a shape that is an inverse of the shape of the color-converting material.

4. The lighting device of claim 3, wherein:
the optical component includes a cured matrix material and color-converting particles distributed within the cured matrix material; and
the optical substrate includes a transparent refractory material.

5. The lighting device of claim 1, wherein:
the color-converting material is a first color-converting material having a first concentration of color-converting particles;
the optical component further include a second color-converting material having a second concentration of color-converting particles, the second concentration being less than the first concentration; and
the walls are at an interface between the first color-converting material and the second color-converting material.

6. The lighting device of claim 1, wherein:
the optical component further includes a non-color-converting material; and
the walls are at an interface between the color-converting material and the non-color-converting material.

7. A lighting device, comprising:
a solid-state device; and
an optical component having a primary zone along a direct path of light emitted from the solid-state device, wherein the optical component includes—
a first color-converting material having—
a first side facing away from the solid-state device,
a second side facing toward the solid-state device,
a first concentration of color-converting particles, and
a pattern of walls defining color-converting features, wherein, within the primary zone, a total surface area of the color-converting features at the walls is greater than a total surface area of the color-converting features at the first side of the color-converting material, and
a second color-converting material having a second concentration of color-converting particles that is less than the first concentration of color-converting particles,
wherein the walls are at an interface between the first color-converting material and the second color-converting material.

8. The lighting device of claim 7, wherein, within the primary zone, the total surface area of the walls is greater than a sum of the total surface area of the color-converting features at the first side of the color-converting material and the total surface area of the color-converting features at the second side of the color-converting material.

9. The lighting device of claim 7, wherein the walls extend generally entirely through a thickness of the first color-converting material within the primary zone, the thickness extending from the first side of the first color-converting material to the second side of the first color-converting material.

10. The lighting device of claim 7, further comprising a trench, wherein the solid-state device is within the trench, and the optical component extends over the trench such that the primary zone is aligned with the trench.

11. The lighting device of claim 7, wherein the optical component is spaced apart from the light-emitting diode.

12. The lighting device of claim 7, wherein:
the pattern of walls defines a shape of the first color-converting material; and
the second color-converting material has a shape that is an inverse of the shape of the first color-converting material.

13. A lighting device, comprising:
a light-emitting diode including a first semiconductor material, a second semiconductor material, and an active region between the first semiconductor material and the second semiconductor material; and
an optical component having a first region and a second region around the first region,
wherein—
light emitted from the light-emitting diode normal to a major side of the active region passes into the first region of the optical component,
light emitted from the light-emitting diode off-normal to the major side of the active region passes into the second region of the optical component, and
at least about 75% of the second region includes a color-converting material having a pattern of walls selected to control a color of light output from the lighting device, and
the first region does not include the pattern of walls.

14. The lighting device of claim 13, wherein the pattern of walls extends generally entirely through a thickness of the color-converting material.

15. The lighting device of claim 13, wherein:
the pattern of walls defines a shape of the color-converting material; and
the optical component further includes an optical substrate having a shape that is an inverse of the shape of the color-converting material.

16. The lighting device of claim 13, wherein the optical component is spaced apart from the light-emitting diode.

17. The lighting device of claim 13, wherein:
the color-converting material is a first color-converting material having a first concentration of color-converting particles;
the optical component further include a second color-converting material having a second concentration of color-converting particles, the second concentration being less than the first concentration; and
the walls are at an interface between the first color-converting material and the second color-converting material.

18. The lighting device of claim 13, wherein:
the optical component further includes a non-color-converting material; and
the walls are at an interface between the color-converting material and the non-color-converting material.

19. The lighting device of claim 13, wherein:
the pattern of walls defines a shape of the color-converting material; and
the optical component further includes an optical substrate having a shape that is an inverse of the shape of the color-converting material.

20. The lighting device of claim 19, wherein:
the optical component includes a cured matrix material and color-converting particles distributed within the cured matrix material; and
the optical substrate includes a transparent refractory material.

21. A lighting device, comprising:
a light-emitting diode, the lighting device having a radiation path along which radiation is emitted by the light-emitting diode, the light-emitting diode including
   a first semiconductor material,
   a second semiconductor material, and
   an active region between the first semiconductor material and the second semiconductor material; and
an optical component positioned along the radiation path, the optical component including—
   a color-converting material having a first side facing toward the light-emitting diode, a second side facing away from the light-emitting diode, and a thickness extending from the first side to the second side,
   a central region, wherein light emitted from the light-emitting diode normal to a major side of the active region passes into the central region, and
   a peripheral region around the central region in a plane parallel to the major side of the active region, wherein light emitted from the light-emitting diode off-normal to the major side of the active region passes into the peripheral region,
wherein—
   the color-converting material includes a pattern of walls that—
      defines negative and positive areas of the optical component in the plane parallel to the major side of the active region,
      is selected to control a color of light output from the lighting device, and
      extends generally entirely through the thickness of the color-converting material, and
   a negative-area-to-positive-area ratio at the central region of the optical component is less than a negative-area-to-positive-area ratio at the peripheral region of the optical component.

22. The lighting device of claim 21, wherein the optical component is spaced apart from the light-emitting diode.

23. The lighting device of claim 21, wherein:
the color-converting material is a first color-converting material having a first concentration of color-converting particles;
the optical component further include a second color-converting material having a second concentration of color-converting particles, the second concentration being less than the first concentration; and
the walls are at an interface between the first color-converting material and the second color-converting material.

24. The lighting device of claim 21, wherein:
the optical component further includes a non-color-converting material; and
the walls are at an interface between the color-converting material and the non-color-converting material.

25. The lighting device of claim 21, wherein:
the pattern of walls defines a shape of the color-converting material; and
the optical component further includes an optical substrate having a shape that is an inverse of the shape of the color-converting material.

26. The lighting device of claim 25, wherein:
the optical component includes a cured matrix material and color-converting particles distributed within the cured matrix material; and
the optical substrate includes a transparent refractory material.

27. A lighting device, comprising:
a light-emitting diode, the lighting device having a radiation path along which radiation is emitted by the light-emitting diode; and
an optical component positioned along the radiation path, the optical component including—
   a color-converting material having—
      a cured matrix material,
      color-converting particles distributed within the cured matrix material,
      a first side facing away from the light-emitting diode,
      a second side facing toward the light-emitting diode,
      a thickness extending from the first side to the second side, and
      a pattern of walls that—
         is selected to control a color of light output from the lighting device,
         extends generally entirely through the thickness of the color-converting material, and
         defines a shape of the color-converting material, and
   an optical substrate including a transparent refractory material and having a shape that is an inverse of the shape of the color-converting material.

28. The lighting device of claim 27, wherein the optical component is spaced apart from the light-emitting diode.

* * * * *